(12) United States Patent
Pyyhtiä et al.

(10) Patent No.: US 6,380,528 B1
(45) Date of Patent: Apr. 30, 2002

(54) IMAGING DEVICE FOR IMAGING RADIATION

(75) Inventors: Jouni Ilari Pyyhtiä, Vantaa; Markku Tapio Eräluoto, Espoo, both of (FI)

(73) Assignee: Simage Oy, Espoo (FI)

( * ) Notice: Subject to any disclaimer, the term of this patent is extended or adjusted under 35 U.S.C. 154(b) by 0 days.

(21) Appl. No.: 09/261,747

(22) Filed: Mar. 3, 1999

(30) Foreign Application Priority Data

Mar. 20, 1998 (GB) ............................................. 9806068

(51) Int. Cl.⁷ ............................ H01L 27/00; H05G 1/64
(52) U.S. Cl. ................................... 250/208.1; 378/98.8
(58) Field of Search ....................... 250/208.1; 378/98.8

(56) References Cited

U.S. PATENT DOCUMENTS

| | | | |
|---|---|---|---|
| 5,331,166 A | | 7/1994 | Yamamoto et al. .... 250/370.11 |
| 5,448,613 A | * | 9/1995 | Haendle et al. ............ 378/98.8 |
| 5,887,049 A | * | 3/1999 | Fossum ...................... 378/98.8 |
| 5,937,027 A | * | 8/1999 | Thevenin et al. .......... 378/98.8 |
| 5,949,848 A | * | 9/1999 | Gilblom .................... 378/98.8 |

FOREIGN PATENT DOCUMENTS

| | | |
|---|---|---|
| EP | 0 817 472 | 1/1998 |
| GB | 2 289 981 | 12/1995 |

* cited by examiner

*Primary Examiner*—F. L. Evans
(74) *Attorney, Agent, or Firm*—Kenyon & Kenyon

(57) ABSTRACT

A semiconductor radiation imaging device is disclosed which includes an array of image elements, each image element of said array comprising an image element detector cell which generates charge in response to radiation incident on said image element and image element circuitry for accumulating said charge from said image element detector cell and for selectively outputting a signal representative of accumulated charge. The imaging device further includes a radiation sensor element, said radiation sensor element comprising a radiation detector cell integral with said image element detector cells for generating charge in response to incident radiation on said radiation sensor element and a radiation sensor output for continuously supplying charge from said radiation detector cell. Also disclosed is an imaging system employing image devices as described above, and a method of imaging radiation.

30 Claims, 4 Drawing Sheets

IMAGING DEVICE FOR IMAGING RADIATION

FIELD OF INVENTION

This invention relates to a self-triggering imaging device for imaging radiation, in particular, but not exclusively, to an imaging device for a self-triggerable imaging system; the imaging device comprising an array of image elements.

BACKGROUND TO INVENTION

Imaging devices comprising an array of image elements of various types are known.

Charged coupled image sensors (also known as charged coupled devices (CCDs)) form one type of known imaging device. A CCD type device operates in the following way:
1. Charge is accumulated within a depletion region created by an applied voltage. For each pixel (image cell) the depletion region has a potential well shape and constrains electrons under an electrode gate to remain within the semiconductor substrate.
2. Voltage is applied as a pulse to the electrode gates of the CCD device to clock each charge package to an adjacent pixel cell. The charge remains inside the semiconductor substrate and is clocked through, pixel by pixel, to a common output.

During this process, additional charge cannot be accumulated.

Another type of imaging device which is known is a semiconductor pixel detector which comprises a semiconductor substrate with electrodes which apply depletion voltage to each pixel position and define a charge collection volume. Typically, simple buffer circuits read out the electric signals when a photon is photo-absorbed or when ionising radiation crosses the depletion zone of the substrate. Accordingly pixel detectors of this type typically operate in a pulse mode, the numbers of hits being accumulated externally to the imaging device. The buffer circuits can either be on the same substrate (EP-A-0,287,197) as the charge collection volumes, or on a separate substrate (EP-A-0,571,135) that is mechanically bonded to a substrate having the charge collection volumes in accordance with, for example, the well known bump-bonding technique.

A further type of device is described in International application WO95/33332. In WO95/33332, an Active-pixel Semiconductor Imaging Device (ASID) is described. The ASID comprises an array of pixel cells including a semiconductor substrate having an array of pixel detectors and a further array of pixel circuits. The pixel detectors generate charge in response to instant radiation. Each pixel circuit is associated with a respective pixel detector and accumulates charge resulting from radiation incident on the pixel detector. The pixel circuits are individually addressable and comprise circuitry which enables charge to be accumulated from a plurality of successive radiation hits on the respective pixel detectors. The device operates by accumulating charge on the gate, for example, of a transistor. Accordingly, analogue storage of the charge value is obtained. At a determined time, the charge from the pixel circuits can be read out and used to generate an image based on the analogue charge values stored in each of the pixel circuits.

CCD devices suffer from disadvantages of limited dynamic range, due to the limited capacity of the potential well inside the semiconductor substrate, and also to the inactive times during which an image is read out. Pulse counting semiconductive pixel devices also have the disadvantage of limited dynamic range. As these devices read the pixel contact when a hit is detected, they suffer from saturation problems at high counting rates. The semiconductor pixel device according to WO95/33332 provides significant advantages over the earlier prior art by providing a large dynamic range for the accumulation of images.

It has been proposed to utilise the above-mentioned CCD and semiconductor devices to replace the film used in conventional radiation imaging systems, in order to provide real-time imaging and a more controlled lower dosage of radiation for a given exposure.

In a known arrangement, a CCD is electrically connected to an X-ray source. When the X-ray source is energised a start signal is transmitted along the connecting wire to the CCD and its control circuitry to begin image acquisition and read-out.

In a optional arrangement disclosed in U.S. Pat. No. 5,513,252 there is no connection to the X-ray source. Instead, the CCD is continually read-out prior to radiation. A signal derived from the CCD is compared with a reference level. If the signal exceeds the reference level, the image acquisition of the CCD is initiated, that is to say the CCD stops being read out and the image starts to accumulate on the CCD.

European Patent Application Publication No. 0 756 416 A1 discloses a CCD used as an imaging device in which charge accumulated in the CCD elements is clocked from several rows into a register in order to sum the charges. The summed result is put to a threshold test. Onset of X-ray radiation is detected when the signal applied to the threshold test exceeds a reference level. Image acquisition is then initiated, as described above i.e. only then will the CCD start accumulating the image.

In yet another arrangement the X-ray source and CCD have again no physical connection. A further sensor is arranged close to the imaging array for the CCD to detect the onset of X-ray radiation. On detection of incident X-ray energy, the sensor sends a signal to the CCD control circuitry to initiate image acquisition, as before.

The foregoing prior art systems involve a delay between activation of the radiation source and initiation of image acquisition. Since in radiation imaging, in particular X-ray imaging, radiation devices should be kept as low as possible it is desirable to reduce the delay as much as possible.

SUMMARY OF INVENTION

In accordance with an embodiment according to a first aspect of the invention there is provided a semiconductor radiation imaging device including:

an array of image elements, each image element of said array comprising an image element detector cell which generates charge in response to radiation incident on said image element and image element circuitry for accumulating said charge from said image element detector cell and for selectively outputting a signal representative of accumulated charge; and a radiation sensor element, said radiation sensor element comprising a radiation detector cell integral with said image element detector cells for generating charge in response to incident radiation on said radiation sensor element and a radiation sensor output for continuously supplying charge from said radiation detector cell.

Preferably, said radiation sensor output is adapted for continuously supplying a signal representative of charge generated in response to radiation incident on said radiation sensor element.

In a preferred embodiment said radiation detector cell is more responsive to incident radiation than an image element detector cell.

Suitably, said radiation detector cell comprises a larger area than said image element detector cell.

Advantageously, said radiation detector cell comprises a guard ring for said array of image element detector cells and optionally the guard ring is substantially continuous.

The imaging device includes a unitary substrate comprising said image element detector cell, said image element circuitry and said radiation detector cell.

Alternatively, the imaging device includes a first and second substrate, the first substrate comprising said image element detector cell and said radiation detector cell, and the second substrate comprising said image element circuitry.

An embodiment in accordance with a second aspect of the invention comprises a self-triggerable imaging system including an imaging device as described in the foregoing paragraphs, the imaging system further comprising control circuitry for controlling the imaging device, an image processor for processing charge values from said array of image elements to form an image on a display device, and threshold circuitry coupled to said radiation sensor output.

Typically, the imaging device comprises threshold circuitry coupled to the radiation sensor output.

In a preferred embodiment the threshold circuitry is operable to output a trigger signal to the control circuitry for the charge or signal on the radiation sensor output exceeding a threshold value.

Preferably, the control circuitry is configurable to initiate image acquisition responsive to said trigger signal from the threshold circuitry. Optionally, the control circuitry is configurable to periodically monitor for the trigger signal.

Suitably, the imaging system further comprises an analogue to digital converter for converting an analogue signal supplied on the radiation sensor output to a digital value, and the digital value is subjected to a threshold test.

In an embodiment according to a third aspect of the invention, there is provided a method comprising providing an imaging device as described above, and including the steps of monitoring said radiation sense output, comparing signals from said radiation sense output with a threshold and outputting a control signal for initiating reading of the array for said charge or signal exceeding the threshold.

In accordance with an embodiment of a yet further aspect of the invention, there is provided a method for providing a trigger signal for radiation imaging comprising, providing a radiation sensor integral with an image plane including an array of radiation detectors for collecting incident radiation for forming a radiation image, the radiation sensor being more responsive to incident radiation than a one of the array of radiation detectors and generating a signal indicative of radiation incident on the radiation sensor, comparing the signal with a threshold, and outputting a control signal for initiating reading of the array for the signal exceeding the threshold.

In a preferred embodiment the method comprises further providing control circuitry for controlling reading the array responsive to said control signal.

Optionally, the step of monitoring comprises periodically monitoring the radiation sensor output or for the control signal.

DESCRIPTION OF PREFERRED EMBODIMENTS OF THE INVENTION

Embodiments of the invention will now be described, by way of example only, with reference to the accompanying drawings in which like elements have like reference signs.

Figure 1:
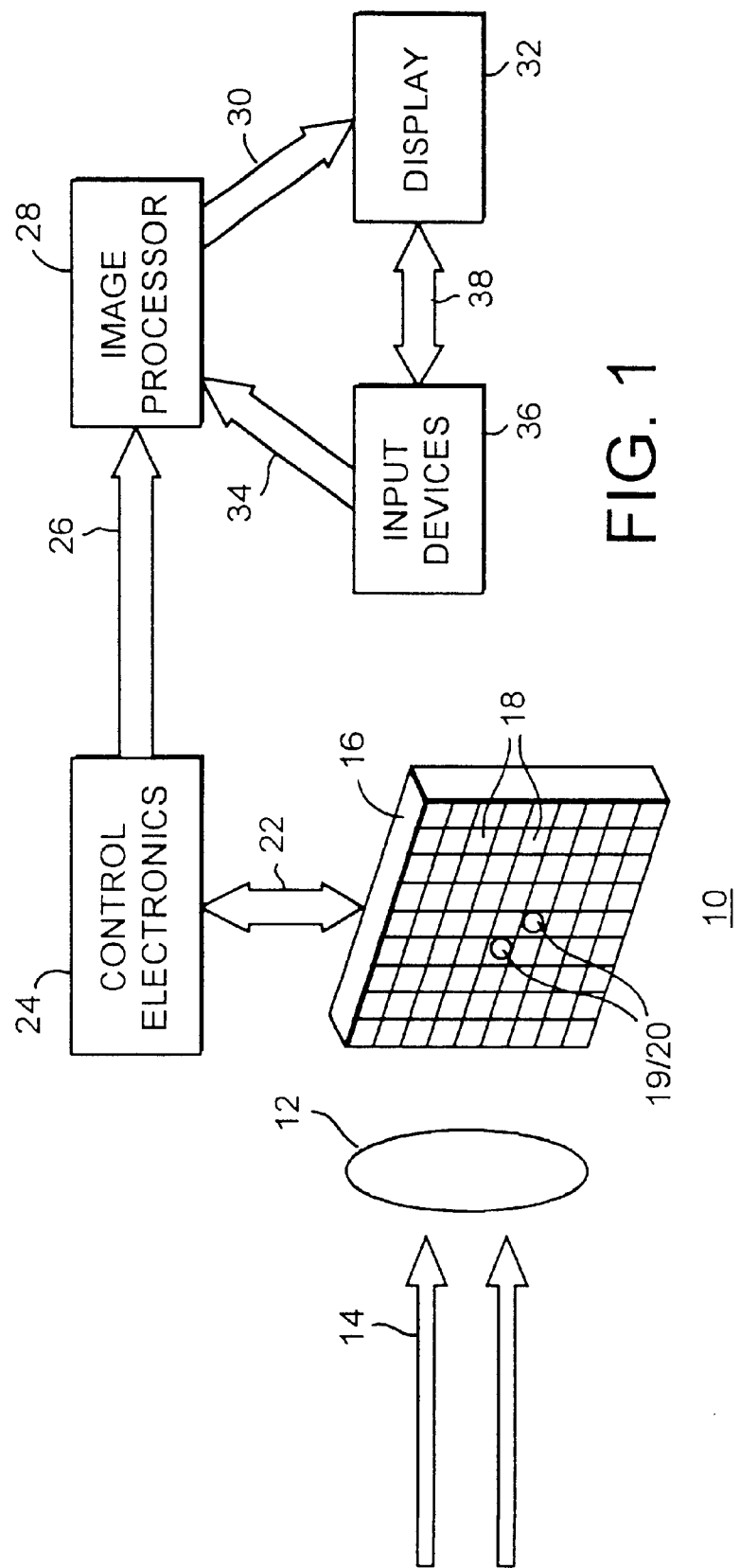
FIG. 1 is schematic block diagram of an overall imaging configuration.

FIG. 1 is a schematic block diagram of one example of an imaging system using an imaging device in accordance with the present invention. This particular embodiment is directed to the imaging of high energy radiation, for example X-ray radiation. By high energy radiation is meant radiation having an energy in excess of approximately 1 KeV. However, the invention is by no means limited to high energy radiation such as X-rays but could be applied to the detection of any particular radiation, for example γ-ray, β-ray, α-ray, infra-red or optical radiation, subject to an appropriate choice of semiconductor substrate.

The imaging system 10 of FIG. 1 is shown to provide imaging of an object 12 subject to radiation 14. In this example the radiation may, for example, be X-ray radiation as mentioned above, but could alternatively be γ-ray, β-ray or α-ray radiation. The object 12 may, for example, be part of a human body. The imaging device 16 comprises a plurality of image elements (here elements 18 of a two dimensional image element array). In the following, reference will be made to image elements, although it will be appreciated that in other embodiments the individual image elements may have a configuration other than that of an element within a two dimensional array (eg a strip arrangement).

The imaging device detects directly high energy incident radiation and accumulates at each image element, a count of the incident radiation hits at that image element.

The imaging device can be configured as a single semiconductor substrate (eg, of silicon) with each image element comprising an image element detector 19 and image element circuitry 20. Alternatively, the imaging device 16 can be configured on two substrates, one with an array of image element detectors and one with an array of corresponding image element circuits 20, the substrates being mechanically connected to each other by, for example, conventional bump-bonding technology or any other appropriate technology.

Figure 2:
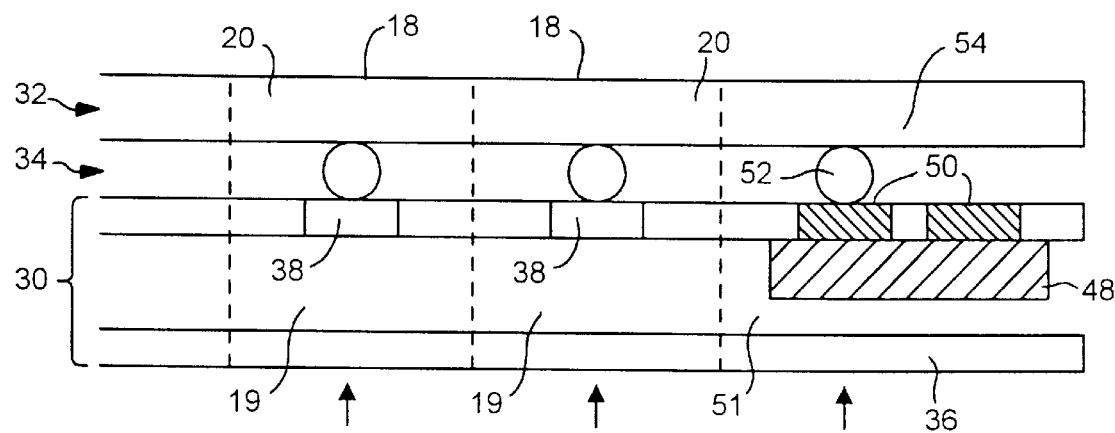
FIG. 2 is a cross-section of one example of an imaging device.

FIG. 2 is a schematic cross section of part of an imaging device 16. In this example, the imaging device 16 comprises an image detector substrate 30 connected to an image circuit substrate 32 by means of bump-bonds 34. An image element detector 19 of each image element 18 is defined on the detector substrate 30 by a continuous electrode 36 which applies a biasing voltage and image element location electrodes 38 to define a detection zone for the image element 18. Corresponding image element circuits 20 on the image circuit substrate 32 are defined at locations corresponding to the electrodes 38 (ie to the image element detectors 19). The image element circuits 20 are electrically connected to corresponding electrodes 38 by bump-bonds 34. In this manner, when charge is generated in an image element detector 19 in response to incident radiation, this charge is passed via the bump-bond 34 to the corresponding image element circuit 20.

The actual size of the image element circuit and the image element detector will depend on the application for which the imaging device is intended.

As mentioned above, the image element detectors and image element circuits could be constructed integrally on a single semiconductor substrate. Such an implementation is possible, but sets challenges unrelated to the present invention, relating to circuit manufacturing techniques. With suitable circuit manufacturing techniques, the invention as described herein is perfectly applicable to implementation on a single semiconductor substrate, as opposed to the dual-substrate technique described herein.

Any appropriate semiconductor materials can be used for the substrates. For example, silicon may be used for the detector substrate and for the image circuit substrate. Other semiconductor materials could be used. For example, for the detector substrate, the material could be selected from: CdZnTe, CdTe, $HgI_2$, InSb, GaAs, Ge, TlBr, Si and PbI.

When an X-ray photo is photo-absorbed in a detection zone of image element detector 19 an electric charge is created, (or charged particle or gamma-ray is incident or absorbed for other embodiments) an electric pulse flows from image element detector 19 via the bump-bonds 34 to corresponding image element circuitry 20.

The particular design and configuration of the image element circuit 20 is not relevant to the instant invention and no further description thereof shall be given, except to say that charge is accumulated within the image element circuit 20 from image element detector 19.

FIG. 2 also shows a guard ring area 48 integral with the detector substrate 30.

The guard ring area 48 generally surrounds all the image elements 18, and may comprise several guard rings 50. The guard rings 50 are made from a conductive material, preferably the same material as used for image element location electrodes 38 in order for the guard rings to be fabricated at the same time as the image element electrodes 38. The guard ring area 48, defined by guard rings 50, reduces charge injection due to crystal defects at the edge of the detector substrate 30 by reducing the localised increase in field strength at the edge for the detector substrate 30 material.

Continuous electrode 36 extends into the guard ring area 48 and also applies a bias voltage in the guard ring area 48. This forms a further detection zone hereinafter referred to as radiation detection cell 57, between the guard ring 48/50 and the continuous electrode 36.

However, the applicant has realised that the guard ring 48/50 is exposed to radiation when the imaging device is irradiated, as well as the image element detectors 19. The applicant has utilised their understanding to provide a novel and inventive approach to the problems of the prior art, and to provide for self-triggering of an imaging device.

At least one of the guard rings 50, although more than one could be used, is coupled via bump-bond 52 to output circuitry 54. Charge created by the absorption of X-ray photons is coupled from the guard ring 50 via bump-bond 52 to the output circuitry 54. Output circuitry 54 is coupled to a radiation sensor output 70.

Figure 3:
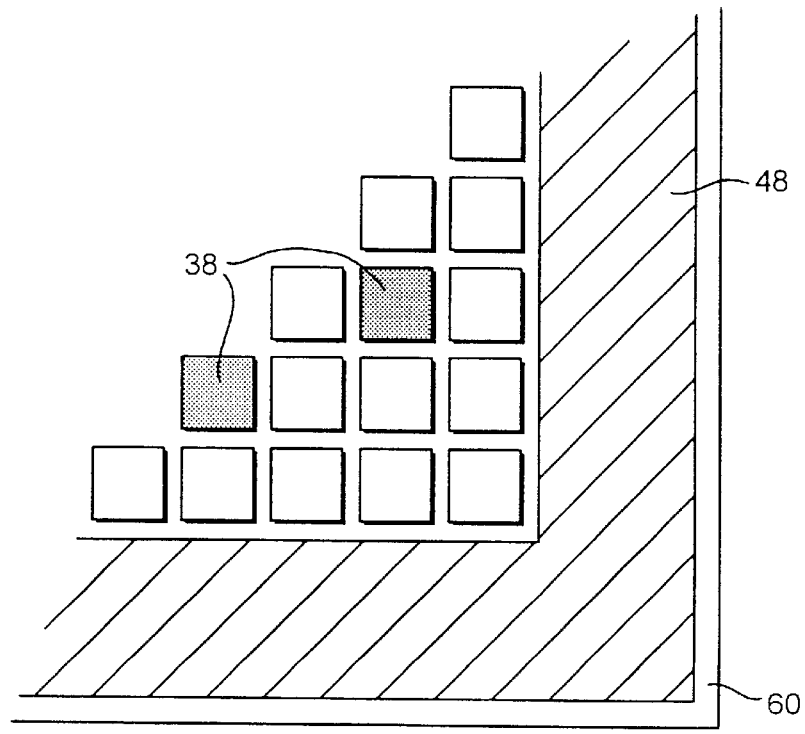
FIG. 3 is a schematic diagram of a plan view of corner of the image device of FIG. 2.

FIG. 3 shows a corner 60 of detector substrate 30. Image element location electrodes 38 are disposed inside the guard ring area 48. As mentioned earlier, radiation incident on the imaging device 16 falls not only on image element location electrodes 38, but also on guard rings 50 comprising the guard ring area 48. The guard ring area 48 may comprise more than one guard ring 50 for gradually reducing the field strength towards the edge of the detector substrate 30. The guard ring 50 is coupled to output circuitry 54 via a bump-band 52, which is directly coupled to a radiation sensor output pin on the imaging device.

An imaging configuration in accordance with an embodiment of the invention will now be described with reference to FIG. 4 of the drawings.

An object 66 is subject to radiation 68 from a radiation source 74. The radiation may be, for example, X-ray radiation, gamma-radiation, beta-ray radiation or alpha-ray radiation. The object 66 may be a part of the human body. As described with reference to the imaging device 16 of FIG. 1, imaging device 72 comprises a plurality of image elements in either a two or one dimensional element array or a strip arrangement, for example. Imaging device 72 is similar to imaging device 16 of FIG. 1 and will be described no further, except to say that imaging device 72 comprises a guard ring 48 as described with reference to FIGS. 2 and 3.

Guard ring 48 is coupled via output circuitry 54, which may be no more than a conductive path, to radiation sensor output 70. Radiation sensor output 70 provides a current Iguard representative of the radiation incident on the guard ring 48. Current Iguard is input to a current to voltage converter 78, and the resulting voltage is input to threshold circuitry 80. The threshold circuitry 80 has input to it a reference threshold voltage 81 ($V_{TH}$).

The threshold circuitry 80 outputs a signal to control electronics 76 indicating that the threshold has been exceeded. Control electronics 76 initiates image acquisition electronics 83, and signals to the system controlling computer 84 that the threshold 81 has been exceeded, i.e. radiation incident an imaging device 72 and image acquisition has been initiated.

Image acquisition comprises integrating the image, ie. charge on each image element, and continues until the threshold circuitry 80 indicates that the voltage has dropped below the threshold 81. That is to say, Iguard drops, indicating that the radiation source 74 has been switched off.

Then the integrated image is read out and the system returns to waiting for a new radiation exposure, i.e. Iguard increases and voltage threshold 81 ($V_{TH}$) exceeded.

Figure 4:
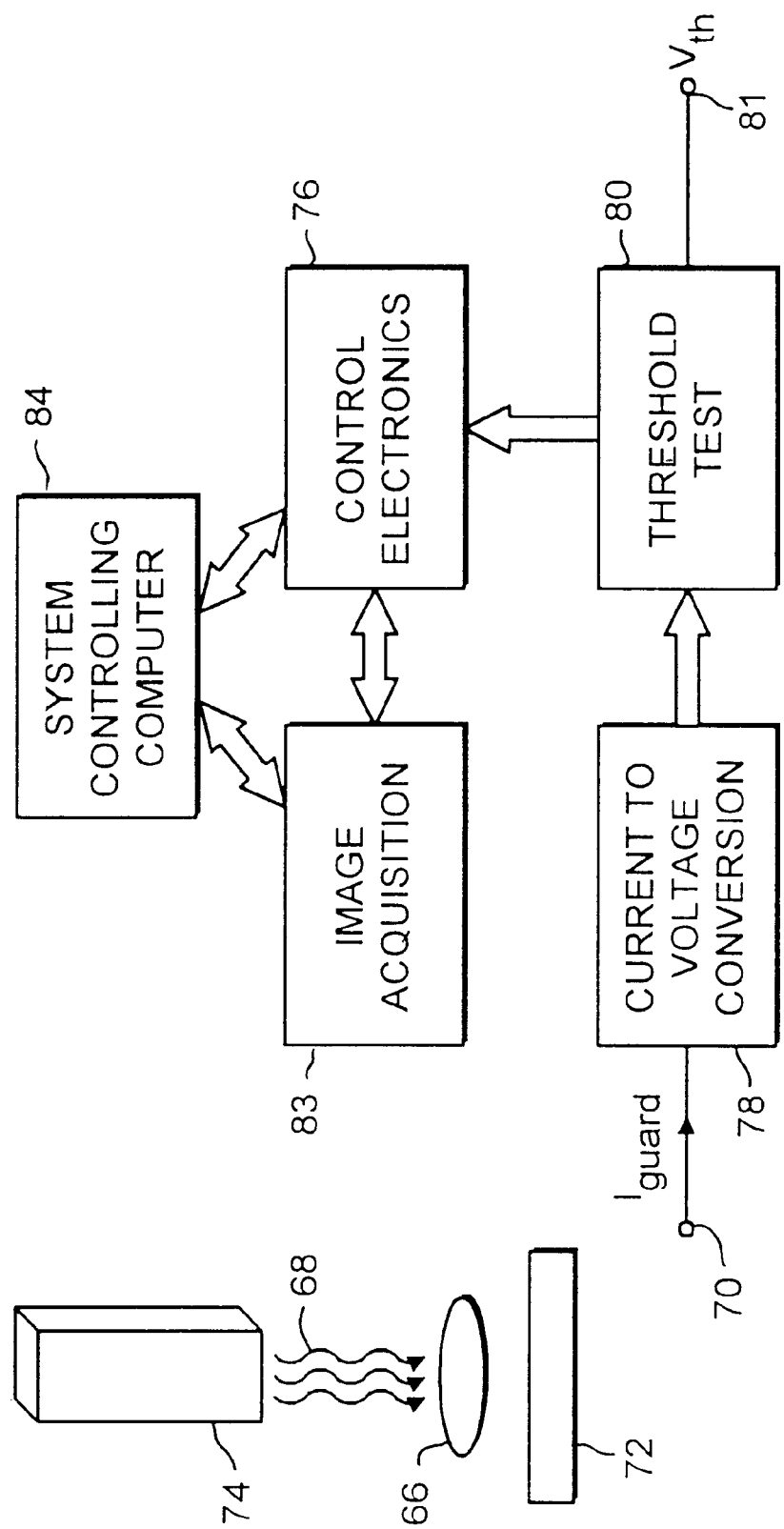
FIG. 4 is a schematic block diagram of an imaging configuration in accordance with an embodiment of the invention.

Whilst the imaging system of FIG. 4 is waiting for the radiation source 74 to be activated, the output current from the guard ring 48 is constantly monitored.

Figure 5:
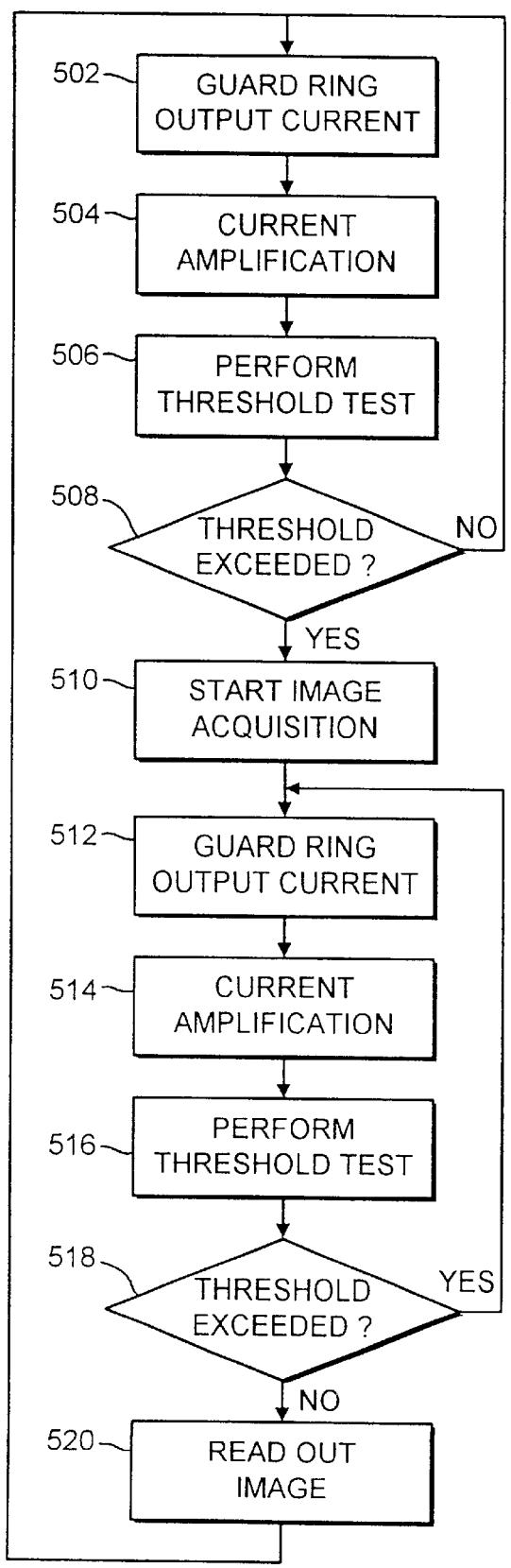
FIG. 5 is a flow chart for operating the configuration shown in FIG. 4.

The operation of a suitably configured system controlling computer 84, will now be described with reference to the steps shown in FIG. 5.

At step 502 Iguard, the guard ring current, is output, and then amplified and converted to a voltage at step 504. A threshold test is performed at step 506, and may be done by discrete circuitry or under program control on a digitised voltage. At step 508 a decision is made as to whether the threshold has been exceeded. Again, such a decision may be by way of discrete circuitry included in threshold circuitry, or under the control of the suitably configured system controlling computer, for example.

If the threshold is not exceeded, the system will continue to monitor the guard ring output, ad the process returns to step 502. Alternatively, if the threshold is exceeded then the image acquisition mode is initiated at step 510. The image is integrated whilst the image acquisition mode is active, and the guard ring output is monitored against the threshold at steps 512, 514 and 516. Whilst the threshold is exceeded, image acquisition continues and the process loops round 512, 514, 516, 518, 512 . . .

However, if at step 518 it is determined, that the threshold is no longer exceeded, radiation source is switched off for example, then the process goes to step 520, where the image is read out. Then the process returns to step 502 begins monitoring for a new exposure.

In view of the foregoing description it will be evident to a person skilled in the art that various modifications may be made within the scope of the invention. For example, the system could be used for non-destructive testing and analysis, as well as in medical imaging.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The application hereby gives notice that new claims may be formulated to such features during the prosecution of this application or of any such further application derived therefrom. In particular, with reference to the appended claims, features from dependent claims may be combined with those of the independent claims in any appropriate manner and not merely in the specific combinations enumerated in the claims.

What we claim is:

1. A semiconductor radiation imaging device including:
    an array of image elements, each image element of said array comprising an image element detector cell which generates charge in response to radiation incident on said image element and image element circuitry for accumulating said charge from said image element detector cell and for selectively outputting a signal representative of accumulated charge; and
    a radiation sensor element, said radiation sensor element comprising a radiation detector cell integral with said image element detector cells for generating charge in response to incident radiation on said radiation sensor element and a radiation sensor output for continuously supplying charge from said radiation detector cell, wherein said radiation detector cell comprises a guard ring for said array of image element detector cells.

2. An imaging device according to claim 1, wherein said radiation sensor output is adapted for continuously supplying a signal representative of charge generated in response to radiation incident on said radiation sensor element.

3. An imaging device according to claim 1, wherein said radiation detector cell is more responsive to incident radiation than an image element detector cell.

4. An imaging device according to claim 1, wherein said radiation detector cell comprises a larger area than said image element detector cell.

5. An imaging device according to claim 1, wherein the guard ring is substantially continuous.

6. An imaging device according to claim 1, including a unitary substrate comprising said image element detector cell, said image element circuitry and said radiation detector cell.

7. An imaging device according to claim 1, including a first and second substrate, the first substrate comprising said image element detector cells and said radiation detector cell, and the second substrate comprising said image element circuitry.

8. An imaging device according to claim 1, comprising threshold circuitry coupled to said radiation sensor output.

9. A self-triggerable imaging system comprising a semiconductor radiation imaging device including:
    an array of image elements, each image element of said array comprising an image element detector cell which generates charge in response to radiation incident on said image element and image element circuitry for accumulating said charge from said element detector cell and for selectively outputting a signal representative of accumulated charge;
    a radiation sensor element, said radiation sensor element comprising a radiation detector cell integral with said image element detector cells for generating charge in response to incident radiation on said radiation sensor element and a radiation sensor output for continuously supplying charge from said radiation detector cell, wherein said radiation detector cell comprises a guard ring for said array of image element detector cells; and
    the imaging system further comprising control circuitry for controlling the imaging device, an image processor for processing charge values from said array of image elements to form an image on a display device, and threshold circuitry coupled to said radiation sensor output.

10. An imaging system according to claim 9, wherein the threshold circuitry is operable to output a trigger signal to the control circuitry for the charge or signal on the radiation sensor output exceeding a threshold value.

11. An imaging system according to claim 10, wherein the control circuitry is configurable to initiate image acquisition responsive to said trigger signal from the threshold circuitry.

12. An imaging system according to claim 11, wherein the control circuitry is configurable to periodically monitor for the trigger signal.

13. An imaging system according to claim 9, further comprising an analogue to digital converter for converting an analogue signal supplied on the radiation sensor output to a digital value.

14. An imaging system according to claim 13 wherein the digital value is input to the threshold circuitry.

15. An imaging system comprising a semiconductor radiation imaging device including:
    an array of image elements, each image element of said array comprising an image element detector cell which generates charge in response to radiation incident on said image element and image element circuitry for accumulating said charge from said image element detector cell and for selectively outputting a signal representative of accumulate charge;
    a radiation sensor element, said radiation sensor element comprising a radiation detector cell integral with said image element detector cells for generating charge in response to incident radiation on said radiation sensor element and a radiation sensor output for continuously supplying charge from said radiation detector cell, wherein said radiation detector cell comprises a guard ring for said array of image element detector cells; and
    the imaging system further comprising control circuitry for controlling the imaging device, and an image processor for processing charge values from said array of image elements to form an image on a display device.

16. An imaging system according to claim 15, further comprising threshold circuitry coupled to the radiation sensor output that is operable to output a trigger signal to the control circuitry for the charge or signal on the radiation sensor output exceeding a threshold value.

17. An imaging system according to claim 16, wherein the control circuitry is configurable to initiate image acquisition responsive to said trigger signal from the threshold circuitry.

18. An imaging system according to claim 17, wherein the control circuitry is configurable to periodically monitor for the trigger signal.

19. An imaging system according to claim 15, further comprising an analogue to digital converter for converting an analogue signal supplied on the radiation sensor output to a digital value.

20. An imaging system according to claim 19, further comprising threshold circuitry coupled to the radiation sensor output, wherein the digital value is input to the threshold circuitry.

21. A method for imaging radiation comprising, providing a semiconductor radiation imaging device including:

an array of image elements, each image element of said array comprising an image detector cell which generates charge in response to radiation incident on said image element and image element circuitry for accumulating said charge from said image element detector cell and for selectively outputting a signal representative of accumulated charge;

a radiation sensor element, said radiation sensor element comprising a radiation detector cell integral with said image element detector cells for generating charge in response to incident radiation on said radiation sensor element and a radiation sensor output for continuously supplying charge from said radiation detector cell, wherein said radiation detector cell comprises a guard ring for said array of image element detector cells; and including the steps of monitoring said radiation sensor output, comparing signals from said radiation sensor output with a threshold and outputting a control signal for initiating reading of the array for said charge or signal on the radiation sensor output exceeding the threshold.

22. A method according to claim 21, wherein the step of monitoring comprises periodically monitoring said radiation sensor output.

23. A method according to claim 21, comprising further providing control circuitry for controlling reading the array responsive to said control signal.

24. A method according to claim 22 further comprising converting an analogue signal indicative of radiation incident on the radiation sensor to a digital value.

25. A method for providing a trigger signal for radiation imaging comprising, providing a radiation sensor integral to an image plane including an array of radiation detectors for collecting incident radiation for forming a radiation image, the radiation sensor being more responsive to incident radiation than one of the array of radiation detectors and generating a signal indicative of radiation incident on the radiation sensor, comparing the signal with a threshold, and outputting a control signal for initiating reading of the array for the radiation sensor signal exceeding the threshold, wherein the radiation sensor comprises a guard ring for the image plane.

26. A method according to claim 25, comprising further providing control circuitry for controlling reading the array responsive to said control signal.

27. A method according to claim 25 further comprising periodically monitoring for said control signal.

28. A method according to claim 25 further comprising converting an analogue signal indicative of radiation incident on the radiation sensor to a digital value.

29. A method according to claim 25, further comprising generating charge in response to radiation incident on a one of said array of radiation detectors and said radiation sensor.

30. A method according to claim 29, further comprising processing charge values read from the array for the radiation sensor signal exceeding the threshold for forming an image on a display device.

* * * * *